(12) United States Patent  
Cohen et al.

(10) Patent No.: US 8,806,742 B2
(45) Date of Patent: Aug. 19, 2014

(54) METHOD OF MAKING AN ELECTRONIC PACKAGE

(75) Inventors: Erwin B Cohen, Essex Junction, VT (US); Martin P Goetz, Raleigh, NC (US); Jennifer V Muncy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 712 days.

(21) Appl. No.: 12/552,411

(22) Filed: Sep. 2, 2009

(65) Prior Publication Data

US 2011/0048795 A1    Mar. 3, 2011

(51) Int. Cl.  
*H05K 3/30* (2006.01)

(52) U.S. Cl.  
USPC ................................ 29/841; 29/832; 438/124

(58) Field of Classification Search  
USPC ............ 29/830, 832, 841; 174/552; 257/675, 257/704, 713, 787, 795; 361/704, 730; 438/121, 127, 124  
See application file for complete search history.

(56) References Cited

U.S. PATENT DOCUMENTS

| | | | |
|---|---|---|---|
| 6,016,006 A | 1/2000 | Kolman et al. | |
| 6,278,182 B1 * | 8/2001 | Liu et al. | 257/713 |
| 6,614,102 B1 * | 9/2003 | Hoffman et al. | 257/659 |
| 6,617,682 B1 | 9/2003 | Ma et al. | |
| 6,882,041 B1 * | 4/2005 | Cheah et al. | 257/704 |
| 6,891,259 B2 | 5/2005 | Im et al. | |
| 7,169,650 B2 | 1/2007 | Rinella et al. | |
| 7,303,005 B2 | 12/2007 | Reis et al. | |

* cited by examiner

*Primary Examiner* — Donghai D Nguyen  
(74) *Attorney, Agent, or Firm* — Steven J. Meyers; Daniel E. McConnell

(57) ABSTRACT

An electronic package has a cover or lid mounted onto a substrate to enclose an electronic device, and a liquid thermal interface material is subsequently inserted (through dispensing, injection molding or printing through apertures in the cover or lid) between the surface of the electronic device and the cover, and cured to a solid state.

1 Claim, 5 Drawing Sheets

METHOD OF MAKING AN ELECTRONIC PACKAGE

FIELD AND BACKGROUND OF INVENTION

This invention is directed to a problem in uniformly applying a thermally conductive interface material (TIM) between an electronic device and an enclosing metal lid or cover. Additionally, the method of application of the thermal material taught here creates a low stress bond between the device and lid, reducing potential of damage to the device.

Known solutions include attaching and bonding a TIM between a lid and an electronic device, typically in a limited coverage area. The TIM is applied either to the inside of the lid or to the surface of the device, and then the lid and electronic device substrate are mated together at the edges of the lid sides. Force is applied typically to the top of the lid to make contact between the lid, the substrate, the TIM and the electronic device simultaneously.

This creates a challenge to manage all surface contacts due to non-planarity on any given surface (lid, TIM, substrate, electronic device), resulting in non-attached areas either between the lid sides and the substrate, the inner side of the lid and TIM, or between the TIM and the electronic device surface. An inadequate attachment can create either environmental or structural damage to the device(s) being packaged, or functional damage to the device due to poor thermal conductivity between the heat source (electronic device) and the lid.

SUMMARY OF THE INVENTION

One purpose of this invention is to provide a metallic cover designed and constructed with four sides and a top or lid and a pattern of aperture openings (holes) in the cover located in the lid surface and/or sides of the cover.

An other purpose is to provide a method of manufacturing an electronic package that consists of mounting a cover or lid onto a substrate, and subsequently inserting a liquid thermal interface material (through dispensing, injection molding or printing through apertures in the cover or lid) between the surface of the electronic device and the cover, and curing the TIM to a solid state.

The advantage of using this invention instead of known solutions is that this invention provides a way to create a uniform, low stress, thermal interface between a heat source (electronic device) and dispersion source (cover or lid) with no loss of thermal conduction caused by air gaps in the TIM or between interfaces and/or non-uniform TIM coverage of the electronic device.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

As briefly mentioned above, the invention has two aspects. The first addressed here is the mechanical structure involved.

Figure 1:
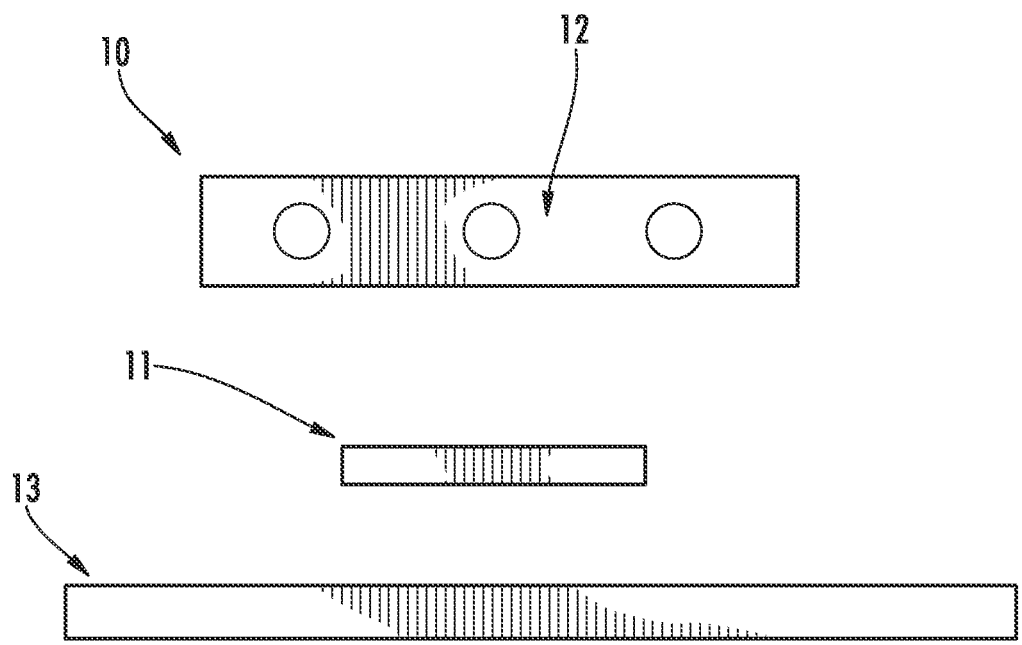
FIG. 1 is a representation of a first form of cover in accordance with this invention, shown in exploded elevation view with other elements.
Figure 2:
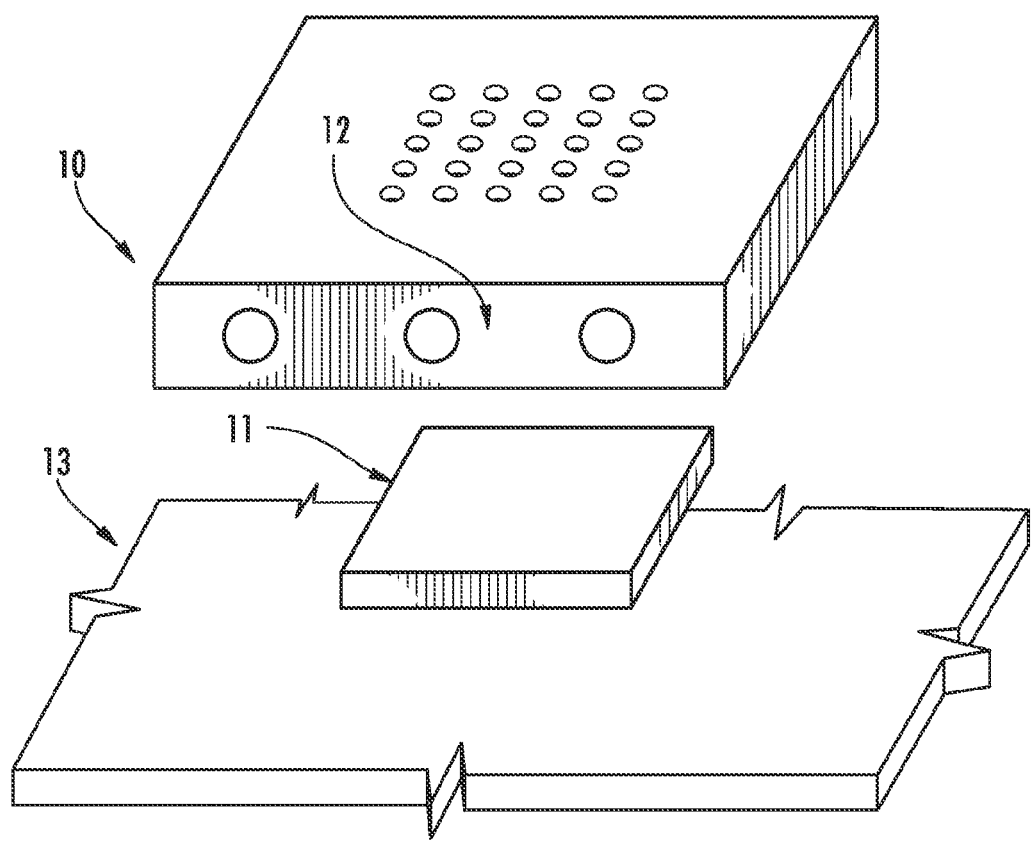
FIG. 2 is a representation of the apparatus of FIG. 1, shown in perspective.
Figure 3:
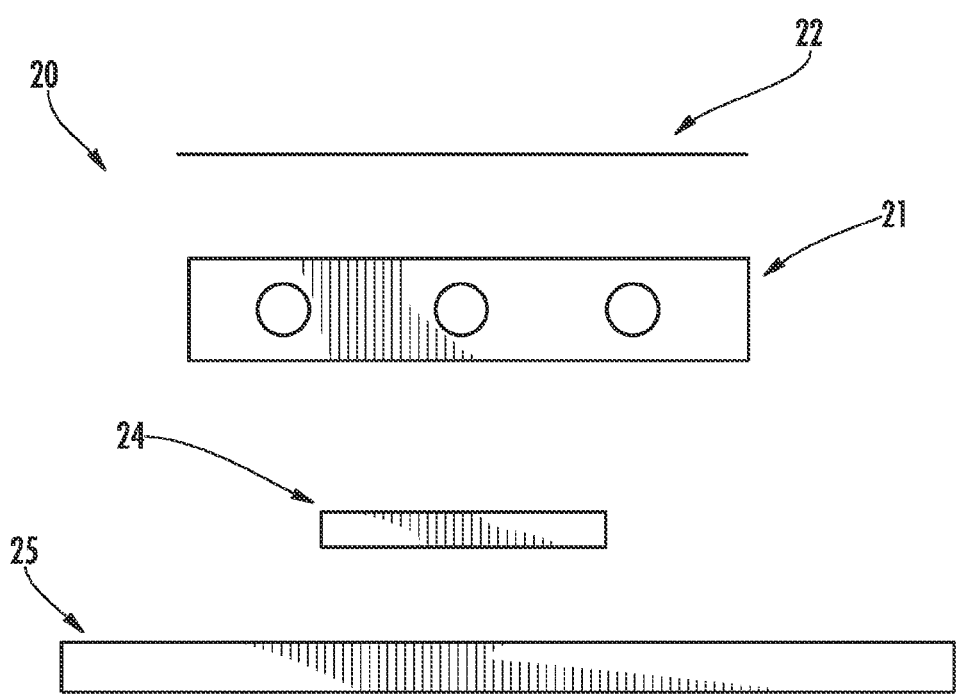
FIG. 3 is a representation of a second form of cover in accordance with this invention, shown in exploded elevation view with other elements.

Referring now to FIGS. 1 through 3, a device cover or lid 10, 20 is designed and manufactured with a top surface and four side walls. As will later appear, the cover may be a unitary stamping (FIGS. 1 and 2) or an assembly of components (FIG. 3). Apertures or openings are patterned on the upper surface 11 and/or the 12 sides of the cover 10. These holes are patterned and located to allow liquid thermal interface materials to be inserted through the holes. The exact pattern, location and size of holes are determined through modeling and process optimization. Modeling of the lid holes, through finite element analysis for example, will provide an understanding of the interaction between lid strength, TIM insertion process, post-dispense curing and outgassing.

As an alternative, the device cover (here, indicated at 20 in FIG. 3) may be fabricated with separate side walls 21 and a separate top or lid 22. When so manufactured, the top 22 will preferably be a snap fit or the like onto the sidewalls 21, facilitating assembly with the substrate.

Figure 5:
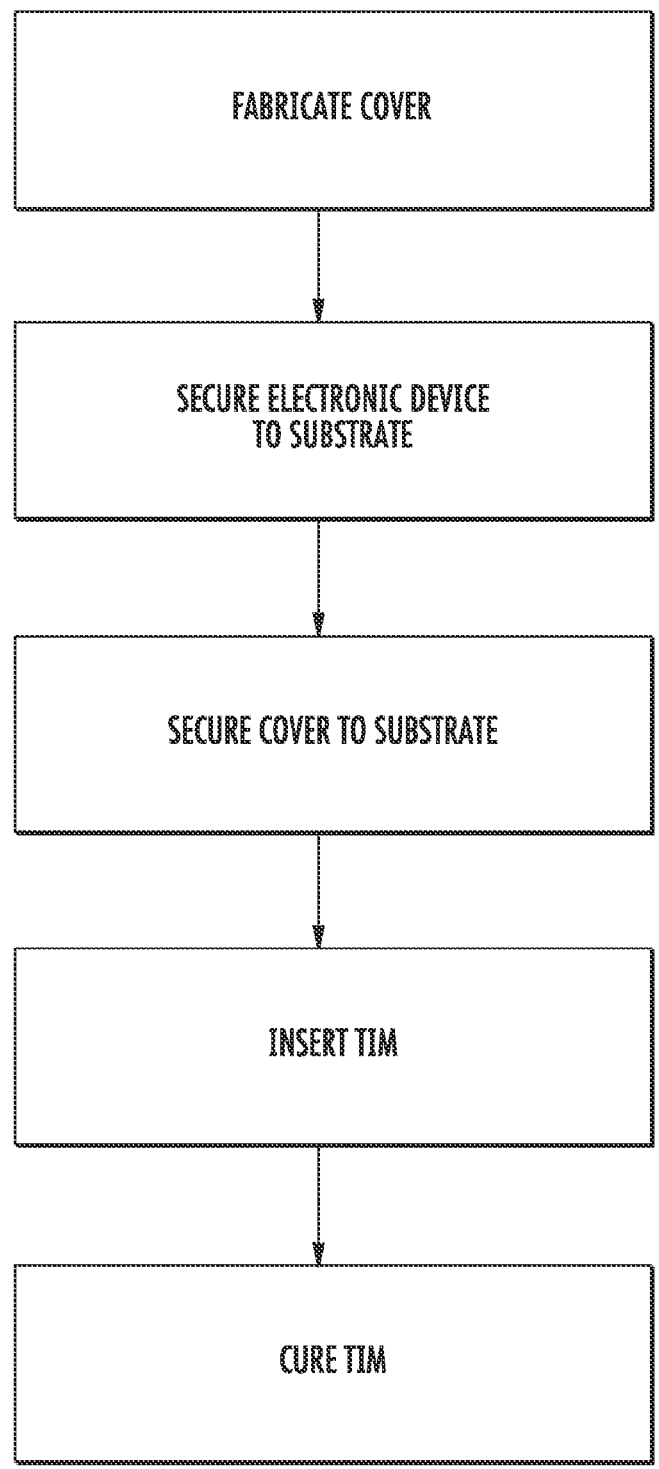
FIG. 5 is a representation of the process of assembling the cover with a substrate and device and completing the installation of a thermally conductive interface material.

The second aspect is the process of assembly using the covers 10, 20 disclosed (FIG. 5). In that process, an electronic device 11, 24 is attached to an interconnect substrate 13, 25 through normal means (either epoxy attach and wirebond connection, or flip chip solder attach and epoxy underfill). The cover 10, 20 is attached to the substrate 12, 25 by conventional means, such as by using a bonding material. The inside of the lid may not contact the electronic device (or any other components that may be on the substrate). As will be understood, the cover 10, 20 encloses the electronic device and defines with the substrate 12, 25 a volume around the electronic device 11, 24, the cover being spaced from the electronic device and having at least one aperture formed therein. After the cover is attached and bonded to the substrate, a liquid thermally conductive material is then inserted (through dispensing, injection or screen printing) through the holes in the lid that are aligned over the surface area of the electronic device or component. As part of this process, excess liquid material may be inserted to ensure complete surface coverage.

The package (module) is then sent through a normal curing process to solidify the thermal interface material. As part of this process, the module may be in a fixture that applies pressure between the lid and the package substrate, causing a uniform cure and forcing any air that might be trapped in the liquid material to outgas. Alternatively, the module may go through a curing process without need for a fixture. Any excess material can be cleaned from surface of the cover if necessary. This can be done either chemically or mechanically.

Figure 4:
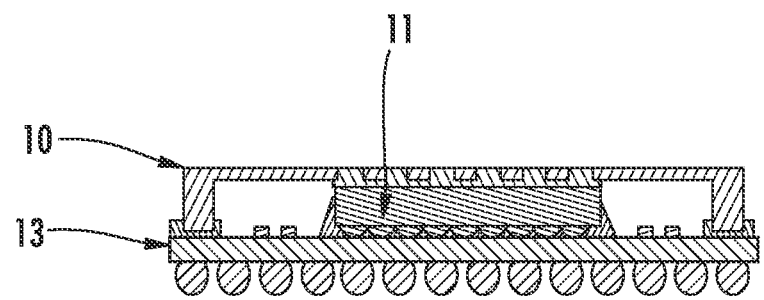
FIG. 4 is a sectional view through an assembled apparatus using the covers of FIGS. 1 and 2 or 3.

By attaching the lid to the substrate and curing first, any warpage between surfaces of the inside of the lid and the electronic device will determined. Subsequently inserting the thermal interface material between the device (heat source) and the lid will provide maximum material uniformity and improved thermal conductivity between source and lid can be established. See FIG. 4. Note in that Figure that the thermal interface material fills the apertures in the lid and a fractional portion of the enclosed space defined by the substrate and the lid, such that voids exist in that space.

In the drawings and specifications there has been set forth a preferred embodiment of the invention and, although specific terms are used, the description thus given uses terminology in a generic and descriptive sense only and not for purposes of limitation.

What is claimed is:

1. Method comprising:

securing an electronic device to a substrate, then;

securing to the substrate a cover enclosing the electronic device and defining with the substrate a volume around the electronic device, the cover being spaced from the electronic device and having a plurality of apertures formed therein, then;

bonding together the cover and the substrate and determining any warpage between surfaces of the inside of the cover and the electronic device, then;

printing a thermally conductive interface material onto the cover and through the plurality of apertures into the volume defined between the cover and the substrate and filling the apertures and a fractional portion of the volume between the electronic device and the cover, the fractional portion being limited to the space between the cover and the upper surface of the electronic device proximate the cover and accommodating any warpage between surfaces of the inside of the cover and the electronic device, then;

curing the thermally conductive material in situ within the assembled substrate, device, cover, and aperture.

* * * * *